United States Patent
Jeong et al.

(10) Patent No.: US 7,593,086 B2
(45) Date of Patent: Sep. 22, 2009

(54) FLEXIBLE FLAT PANEL DISPLAY

(75) Inventors: Jae-Kyeong Jeong, Suwon-si (KR);
Jae-Bon Koo, Suwon-si (KR);
Hyun-Soo Shin, Suwon-si (KR);
Se-Yeoul Kwon, Suwon-si (KR);
Yeon-Gon Mo, Suwon-si (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 259 days.

(21) Appl. No.: 11/523,607

(22) Filed: Sep. 20, 2006

(65) Prior Publication Data
US 2007/0085961 A1    Apr. 19, 2007

(30) Foreign Application Priority Data
Oct. 14, 2005    (KR) .................. 10-2005-0096939

(51) Int. Cl.
G02F 1/1345    (2006.01)
(52) U.S. Cl. ..................................... 349/150; 349/149
(58) Field of Classification Search .......... 349/149–150
See application file for complete search history.

(56) References Cited

FOREIGN PATENT DOCUMENTS

| | | |
|---|---|---|
| JP | 4-178684 | 6/1992 |
| JP | 11-272205 | 10/1999 |
| JP | 2005-251845 | 9/2005 |
| WO | WO 02/056284 | 7/2002 |

OTHER PUBLICATIONS

Office action from the Japanese Patent Office issued in Applicant's corresponding Japanese Patent Application No. 2006-187174 dated Apr. 7, 2009.

*Primary Examiner*—Frank G Font
*Assistant Examiner*—Eric Wong
(74) *Attorney, Agent, or Firm*—Robert E. Bushnell, Esq.

(57) ABSTRACT

A flexible flat panel display prevents electronic units, such as a flexible printed circuit board and a driving IC, from being separated from the flexible flat panel display even when the display unit is bent. The flexible flat panel display includes: a flexible display unit including a display area adapted to display an image, a first side and a second side parallel to edges of the display area, and a third side and a fourth side perpendicular to the first and second sides, the third side and the fourth being adapted to being bent; and electronic units arranged solely on at least one of the first and second sides and absent the third and fourth sides.

23 Claims, 7 Drawing Sheets

FLEXIBLE FLAT PANEL DISPLAY

CLAIM OF PRIORITY

This application makes reference to, incorporates the same herein, and claims all benefits accruing under 35 U.S.C. §119 from an application for FLEXIBLE FLAT PANEL DISPLAY DEVICE earlier filed in the Korean Intellectual Property Office on the 14 of Oct. 2005 and there duly assigned Serial No. 10-2005-0096939.

BACKGROUND OF THE INVENTION

1. Field of the Invention

The present invention relates to a flexible flat panel display, and more particularly, to a flexible flat panel display which prevents electronic units such as a driving Integrated Circuit (IC) and a flexible printed circuit board from being separated from the flexible flat panel display even when the flexible flat panel display is bent.

2. Description of the Related Art

A flat panel display such as a liquid crystal display, an organic light emitting device, or an inorganic light emitting device has a flat shape and can be used as a flexible display.

In order to be connected to an external circuit device, the flat panel display is bonded to a flexible printed circuit board. A driving Integrated Circuit (IC) is directly mounted on the flexible display. The flexible printed circuit board or the driving IC is bonded to a pad unit formed on an edge of the flat panel display via an anisotropy conductive adhesive. Alternatively, the flexible printed circuit board or the driving IC is attached to a lateral or longitudinal side of a flat panel display.

The flexible flat panel display can be bent in at least one direction, and can be used in a bent state. For example, the flexible flat panel display can be bent in a specific direction and attached to a cylinder or the like.

However, when the flexible flat panel display is bent, the flexible printed circuit board or the driving IC placed on a bent side will likely separate from the flexible flat panel display due to the bending stress. In this case, the flat panel display is electrically open and an image cannot be displayed.

SUMMARY OF THE INVENTION

The present invention provides a flexible flat panel display in which a flexible printed circuit board and a driving Integrated Circuit (IC) are not separated from the flexible flat panel display even when the flexible flat panel display is bent.

According to one aspect of the present invention, a flexible flat panel display is provided, the flexible flat panel display including: a flexible display unit including a display area adapted to display an image, a first side and a second side parallel to edges of the display area, and a third side and a fourth side perpendicular to the first and second sides, the third side and the fourth being adapted to being bent; and electronic units arranged solely on at least one of the first and second sides and absent the third and fourth sides. The electronic unit is arranged on the first side and includes a scan driving circuit. The electronic unit arranged on the first side includes a scan driving IC including the scan driving circuit. The electronic unit arranged on the first side includes a scan driving unit including the scan driving circuit and is patterned on the first side.

The electronic unit is preferably arranged on the second side and includes a data driving circuit. The electronic unit arranged on the second side preferably includes a data driving IC including the data driving circuit. The electronic unit arranged on the second side preferably includes a data driving unit which includes the data driving circuit and is patterned on the second side.

The electronic unit is alternatively preferably arranged on the first side and includes a flexible circuit board bonded to the first side.

The electronic unit is alternatively preferably arranged on the second side and includes a flexible circuit board bonded to the second side.

The electronic unit is preferably arranged on the first side and includes a first scan driving circuit and a first data driving circuit. The electronic unit arranged on the first side preferably includes a first scan driving IC including the first scan driving circuit. The electronic unit arranged on the first side alternatively preferably includes a first scan driving unit including the first scan driving circuit and is patterned on the first side. The electronic unit arranged on the first side alternatively preferably includes a first data driving IC including the first data driving circuit. The electronic unit arranged on the first side alternatively preferably includes a first data driving unit including the first data driving circuit and is patterned on the first side.

The electronic unit is alternatively preferably arranged on the second side and includes a second scan driving circuit and a second data driving circuit. The electronic unit arranged on the second side preferably includes a second scan drive IC including the second scan driving circuit. The electronic unit arranged on the second side alternatively preferably includes a second scan driving unit including the second scan driving circuit and is patterned on the second side. The electronic unit arranged on the second side alternatively preferably includes a second data driving IC including the second data driving circuit. The electronic unit arranged on the second side alternatively preferably includes a second data driving unit including the second data driving circuit and is patterned on the second side.

According to another aspect of the present invention, a flexible flat panel display is provided including: a display area adapted to be bent in at least one direction and to display an image; a plurality of first wires intersecting the display area and extending along sides of the display area, the sides of the display area being bent; and a plurality of second wires intersecting the display area and extending along other sides of the display area, the other sides of the display area not being bent; the first wires and the second wires extending along the sides of the display area to locations external to the display area.

The first wires and the second wires preferably extend in opposite directions external to the display area. The first wires and the second wires alternatively preferably extend in the same direction external to the display area.

External to the display area, some of the first wires and second wires alternatively preferably extend in one bending direction of the bent sides of the display area, and the other of the first wires and second wires preferably extend in another bending direction different from the one bending direction.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

Figure 1:
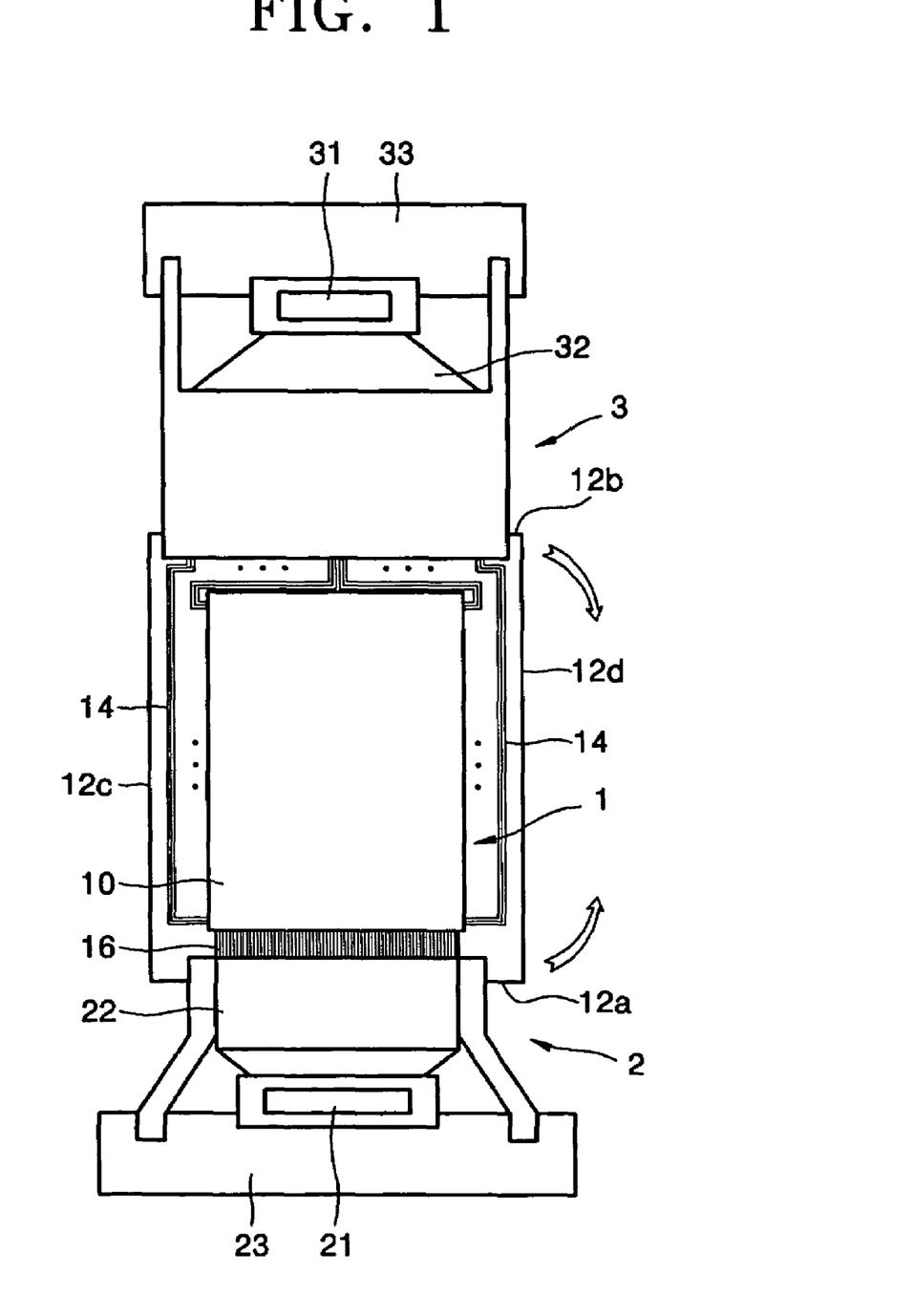
FIG. 1 is a plan view of a flexible flat panel display according to an embodiment of the present invention.

FIG. 1 is a plan view of a flexible flat panel display according to an embodiment of the present invention.

Referring to FIG. 1, the flexible flat panel display includes a flexible display unit 1, and a first electronic unit 2 and a second electronic unit 3 bonded to the display unit 1. The flexible display unit 1, as shown in FIG. 1, can have a rectangular shape, and includes a first side 12a and a second side 12b, which are short sides parallel to each other, and a third side 12c and a fourth side 12d which are long sides parallel to each other.

The flexible display unit 1 can be bent in at least one direction. In the present embodiment, the flexible display unit 1 can be bent in the arrow directions indicated in FIG. 1. That is, the first side 12a through the fourth side 12d of the flexible display unit 1 can be bent, and the flexible display unit 1 can be used in a state in which the long sides, i.e., the third and fourth sides 12c and 12d, are bent.

A display area 10 is formed in the center of the flexible display unit 1. The display area 10 can be formed using an Active-Matrix (AM) organic light emitting device, as shown in FIG. 2.

Figure 2:
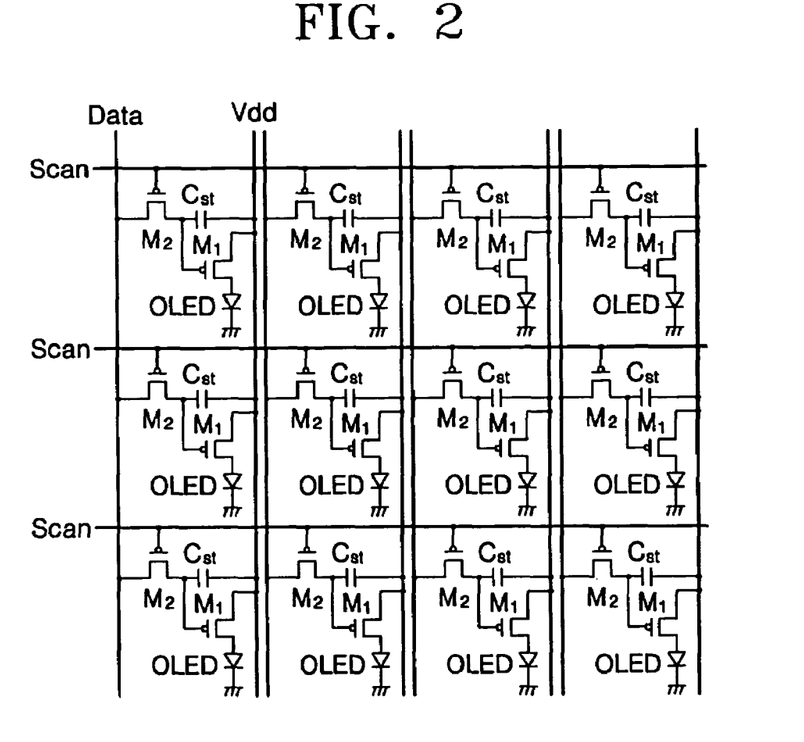
FIG. 2 is a circuit diagram of pixels of an Active-Matrix (AM) organic light emitting display, which is an example of a display area of FIG. 1.

Referring to FIG. 2, each pixel of the AM organic light emitting device according to an embodiment of the present invention includes at least two Thin Film Transistors (TFTs), that is, a driving TFT $M_1$ and a switching TFT $M_2$, a storage capacitor $C_{st}$ and an Organic Light Emitting Diode (OLED).

The switching TFT $M_2$ is turned on or off in response to a scan signal supplied to a scan line Scan, and transmits a data signal supplied to a data line Data to the storage capacitor $C_{st}$ and the driving TFT $M_1$. The driving TFT $M_1$ determines a current flowing into the OLED from a Vdd line in response to the data signal supplied through the switching TFT $M_2$. The storage capacitor $C_{st}$ stores the data signal transmitted through the switching TFT $M_2$ for one frame.

In FIG. 2, the driving TFT $M_1$ and the switching TFT $M_2$ are P type Metal Oxide Semiconductor (PMOS) TFTs, but the present invention is not limited thereto. At least one of the driving TFT $M_1$ and the switching TFT $M_2$ can be an N type Metal Oxide Semiconductor (NMOS) TFT. Moreover, the number of thin film transistors and capacitors is not limited to the above description, and more thin film transistors and capacitors can be included in each pixel.

Figure 3:
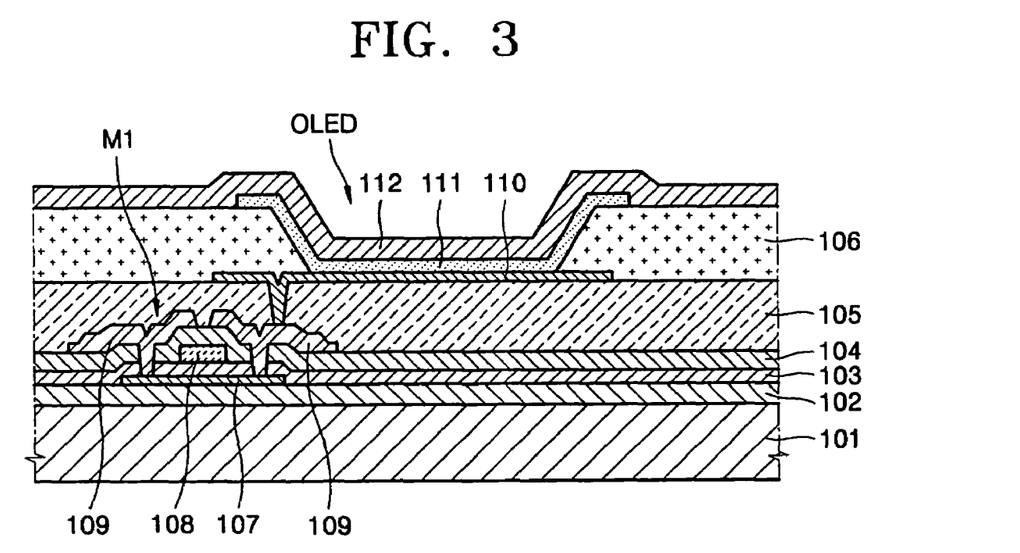
FIG. 3 is a cross-sectional view of an example of a portion of the AM organic light emitting display of FIG. 2.

FIG. 3 is a cross-sectional view of an example of a portion of the AM organic light emitting display of FIG. 2. Referring to FIG. 3, the driving TFT $M_1$ and the OELD are formed on a substrate 101. Although the switching TFT $M_2$ and the storage capacitor $C_{st}$ are not illustrated in FIG. 3, they can be formed by the same processes used to form the driving TFT $M_1$.

The substrate 101 can be made of acryl, polyimide, polycarbonate, polyester, mylar, or an other plastic material, but the present invention is not limited thereto. For example, the substrate 101 can be made of a metal foil, such as Stainless Steel (SUS) or tungsten, or a thin glass. The substrate 101 is flexible.

An insulating layer 102, such as a barrier layer and/or a buffer layer, can be formed on the substrate 101 to prevent diffusion of impurity ions and penetration of moisture or air and to planarize a surface of the substrate 101.

An active layer 107 of the driving TFT $M_1$ is formed of a semiconductor material on the insulating layer 102, and a gate insulating layer 103 is formed to cover the active layer 107. The active layer 107 can be formed of an inorganic semiconductor, such as amorphous silicon or poly silicon, or an organic semiconductor.

A gate electrode 108 is disposed on the gate insulating layer 103, and an interlayer insulating layer 104 is formed to cover the gate electrode 108. Then, source/drain electrodes 109 are formed on the interlayer layer 104, and a passivation layer 105 and a pixel defining layer 106 are sequentially formed to cover the source/drain electrodes 109.

The gate electrode 108 and the source/drain electrodes 109 can be formed of a metal, such as Al, Mo, Au, Ag, Pt/Pd, or Cu, but the present invention is not limited thereto. The gate electrode 108 and the source/drain electrodes 109 can be coated with a resin paste including a metal powder, or can be formed of a conductive polymer.

The gate insulating layer 103, the interlayer layer 104, the passivation layer 105, and the pixel defining layer 106 can be formed as insulators having a single layer or multiple layers formed of an organic material, an inorganic material, or a compound of organic and inorganic materials.

The layer structure of the driving TFT $M_1$ is not limited to that described above, and the driving TFT $M_1$ can have a variety of layer structures.

A pixel electrode 110, that is, one electrode of the OLED, is formed on the passivation layer 105, and the pixel defining layer 106 is formed on the pixel electrode 110. Then, a predetermined opening portion is formed on the pixel defining layer 106 to exposed the pixel electrode 110, and an organic light emitting layer 111 of the OLED is formed in the open portion.

The OLED displays a predetermined image by emitting red, green, and blue light according to a current flow, and includes the pixel electrode 110 connected one of the source/drain electrodes 109 of the driving TFT $M_1$, a counter electrode 112 covering all of the pixels, and the organic light emitting layer 111 that is interposed between the pixel electrode 110 and the counter electrode 112 and emits light.

The pixel electrode 110 and the counter electrode 112 are insulated from each other by the organic light emitting layer 111, and the organic light emitting layer 111 emits light by applying voltages of different polarities.

The organic light emitting layer 111 can be a small molecule organic layer or a polymeric organic layer. When a small molecule organic layer is used, the organic layer can be formed by a structure of a Hole Injection Layer (HIL), a Hole Transport Layer (HTL), an EMission Layer (EML), a Electron Transport Layer (ETL), an Electron Injection Layer (EIL), or the like, and an available organic material can be copper phthalocyanine (CuPc), N,N'-Di(naphthalene-1-yl)-N,N'-diphenyl-benzidine (NPB), tris-8hydroxyquinoline aluminium (Alq3), or the like. The small molecule organic layer is formed by a vapor deposition method.

In the case of a polymeric organic layer, the organic layer is formed by an HTL and an EML, and the HTL is made of polyethylenedioxythiophene (PEDOT), and the EML is made of a polymeric organic material, such as poly-phenylenevinylene (PPV) group or a polyfluorene group, and is formed by a screen printing or an inkjet printing method.

The organic layer is not limited to the above description, and can be formed in various ways.

The pixel electrode 110 acts as an anode electrode, and the counter electrode 112 acts as a cathode electrode. However, the functions of the pixel electrode 110 and the counter electrode 112 can be reversed.

In the case of a bottom emission type, the pixel electrode 110 can be a transparent electrode, and the counter electrode 112 can be a reflective layer. The transparent electrode can be made of ITO, IZO, $In_2O_3$, or ZnO, which is transparent and has a high work function, and the reflective layer can be made of a metal, such as Ag, Mg, Al, Pt, Pd, Au, Ni, Nd, Ir, Cr, Li, Ca, or a compound of these metals, which has a low work function.

In the case of a top emission type, the pixel electrode 110 can be a reflective electrode, and the counter electrode 112 can be a transparent electrode. In this case, the reflective electrode, that is, the pixel electrode 110, is fabricated by forming a reflective layer made of Ag, Mg, Al, Pt, Pd, Au, Ni, Nd, Ir, Cr, Li, Ca, or a compound of these metals and then forming a layer made of ITO, IZO, ZnO, or $In_2O_3$, which has a high work function, on the reflective layer. The transparent electrode, that is, the counter electrode 112 is formed in a thin film, by depositing metal with a low work function, that is, Ag, Mg, Al, Pt, Pd, Au, Ni, Nd, Ir, Cr, Li, Ca, or a compound of these metals, and then forming an auxiliary electrode layer or a bus electrode line with a transparent conductive material, such as ITO, IZO, ZnO, or $In_2O_3$.

In the case of a dual emission type, both the pixel electrode 110 and the counter electrode 112 can be transparent electrodes.

The material of the pixel electrode 110 and the counter electrode 112 is not limited to that described above. The pixel electrode 110 and the counter electrode 112 can be made of a conductive material or conductive paste containing conductive particles, such as Ag, Mg, or Cu. When the conductive paste is used, the conductive paste can be printed using a inkjet printing method, and after printing, an electrode can be formed by plasticizing the paste.

After fabricating the OLED, the top of the OLED is sealed to protect it from air.

Referring again to FIG. 1, the scan lines Scan shown in FIG. 2 extend toward the outside of the display area 10 and are connected to scan wires 14, and the data line Data extends toward the outside of the display area 10 and are connected to data wires 16.

The scan wires 14 and the data wires 16 extend in a bending direction of the flexible display unit 1, that is, along bent sides of the flexible display unit 1. Specifically, the scan wires 14 are stretched from the display area 10 to the third side 12c and the fourth side 12d, extend along the third side 12c and the fourth side 12d, and form a scan pad on the second side 12b. The data wires 16 extend along the first side 12a and form a data pad on the first side 12a.

The first electronic unit 2 is connected to the data pad formed on the first side 12a, and the second electronic unit 3 is connected to the scan pad formed on the second side 12b. The first electronic unit 2 can include a data driving IC 21, a flexible printed circuit board 22 on which the data driving IC 21 is mounted, and a printed circuit board 23 connected to the flexible printed circuit board 22. The flexible printed circuit board 22 can be bonded to the data pad. The second electronic unit 3 includes a scan driving IC 31, a flexible printed circuit board 32 on which the scan driving IC 31 is mounted, and a printed circuit board 33 connected to the flexible printed circuit board 32. The flexible printed circuit board 32 is bonded to the scan pad.

Although other signal wires including Vdd wires are not illustrated in FIG. 1, the signal wires extend in a bending direction, that is, along the bent sides, and form pads on the first side 12a and the second side 12b. Moreover, the signal wires are connected to the first electronic unit 2 and the second electrode unit 3, or an additional electronic unit and provides them with a signal and current.

According to the present embodiment, as shown in FIG. 1, the third side 12c and the fourth side 12d are not connected to any electronic units. Therefore, even when the flexible display unit 1 is bent, the first electronic unit 2 and the second electronic unit 3 are not affected by a bending stress, and the first and second electronic units 2 and 3 are prevented from being separated from the flexible display unit 1.

Figure 4:
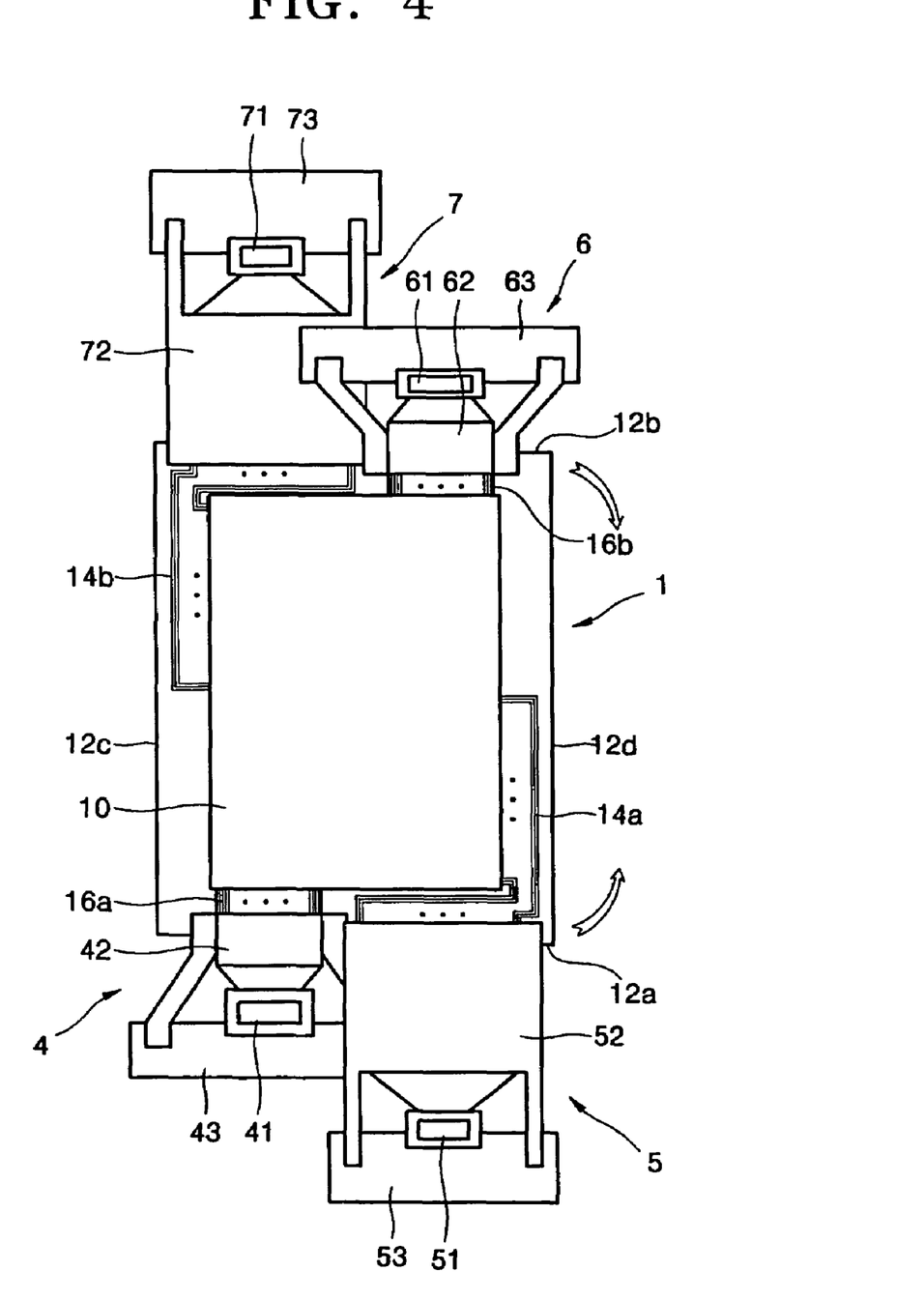
FIG. 4 is a plan view of a flexible flat panel display according to another embodiment of the present invention.

FIG. 4 is a plan view of a flexible flat panel display according to another embodiment of the present invention. The flexible flat panel display of FIG. 4 solves a problem where the pixel response speeds can be different due to the long scan wires 14. To this end, a scan section of the display area 10 is divided into two sections, and a first scan section extends to the first side 12a via first scan wires 14a and is connected to a first scan driving IC 51 of a fourth electronic unit 5, and a second scan section extends to the second side 12b via second wires 14b and is connected to a second scan driving IC 71 of a sixth electronic unit 7. Hence, a distance difference between the farthest pixel and the closest pixel from each of the scan driving IC can be somewhat reduced, and therefore, voltage drop in the scan lines and differences between response speeds can be reduced. Moreover, in this case, a part of the data line extends to the first side 12a and is connected to a first data driving IC 41 of a third electronic unit 4, and the other part extends to the second side 12b and is connected to a second driving IC 61 of a fifth electronic unit 6. The third, fourth, fifth, and sixth electronic units 4, 5, 6, and 7 includes flexible printed circuit boards 42, 52, 62, and 72 and printed circuit board 43, 53, 63, and 73, respectively.

The present embodiment is not limited to the above-described electronic units including the flexible printed circuit board on which a scan driving IC or a data driving IC are mounted, and/or the printed circuit board. The electronic units can include a scan driving unit having a scan diving circuit or a data driving unit having a data driving circuit, wherein the scan driving circuit and the data driving circuit are formed by a deposition and patterning method.

Figure 5:
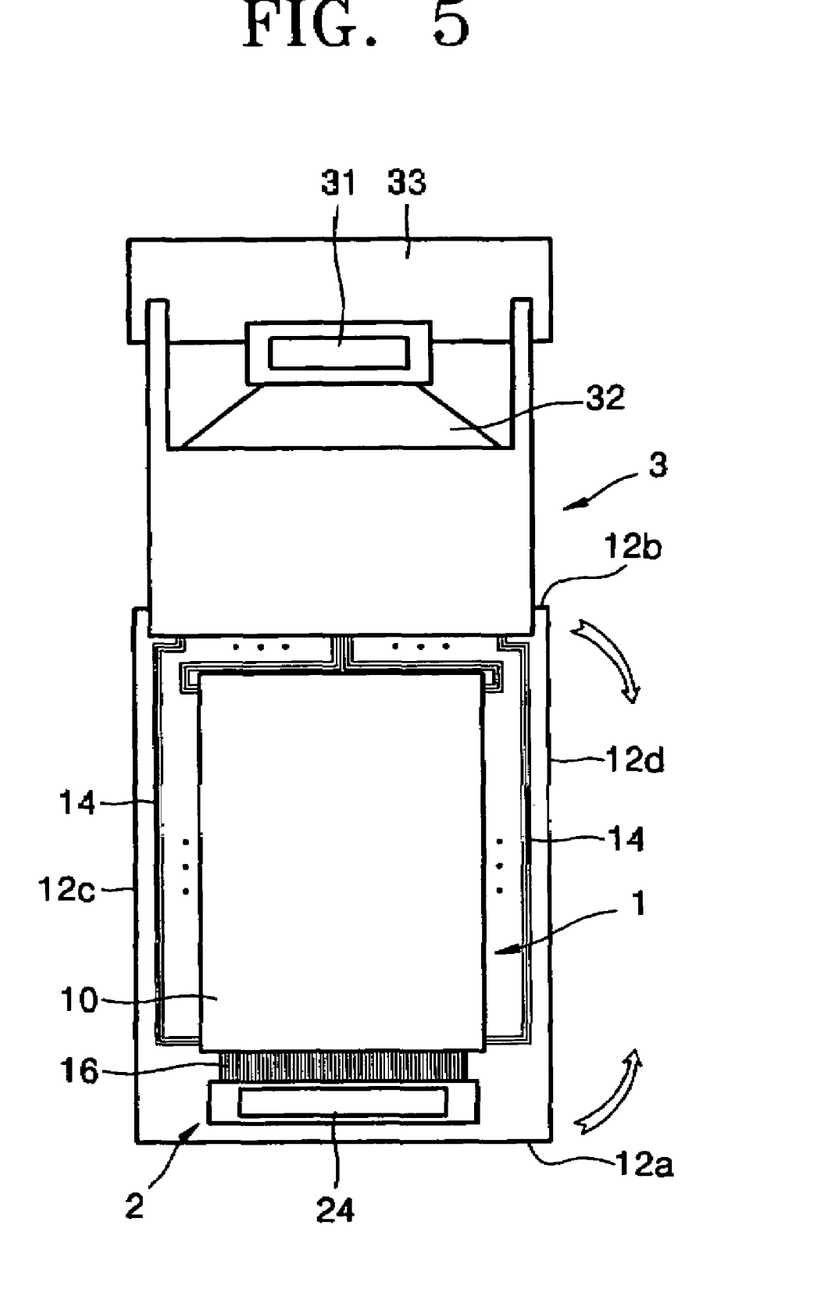
FIG. 5 is a plan view of a flexible flat panel display according to another embodiment of the present invention.
Figure 6:
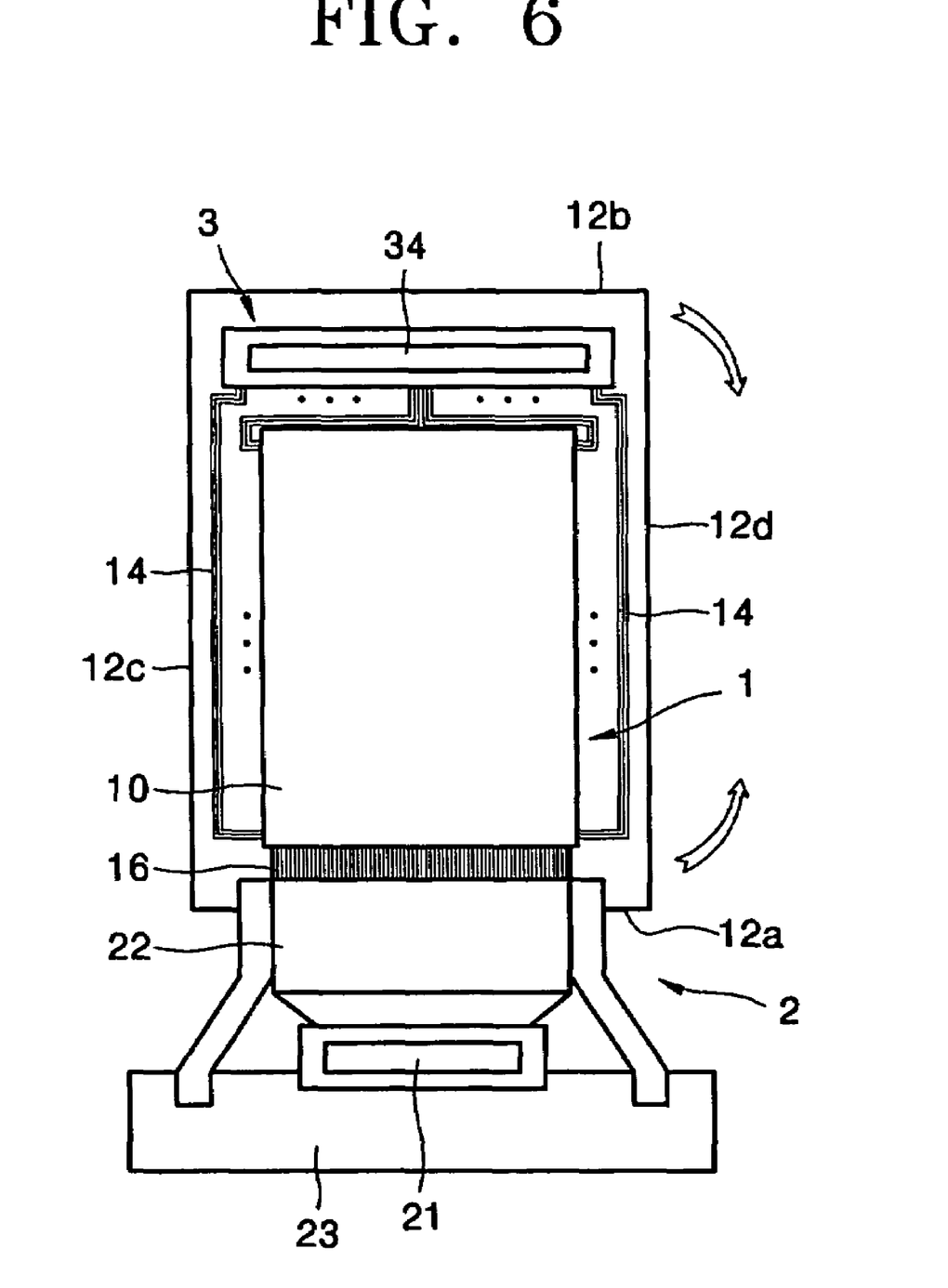
FIG. 6 is a plan view of a flexible flat panel display according to another embodiment of the present invention.

Referring to FIG. 5, the first electronic unit 2 is formed by a data driving unit 24 including a data driving circuit. Referring to FIG. 6, the second electronic unit 3 is formed by a scan driving unit 34 including a scan driving circuit. The data driving unit 24 and the scan driving unit 34 can be a data driving IC and a scan driving IC. The data driving unit 24 and the scan driving unit 34 can include a plurality of PMOS TFTs, NMOS TFTs, or CMOS TFTs. Although not illustrated, each of the first electronic unit and the second electronic unit can formed by a data driving unit including a data driving circuit and a scan driving unit including a scan driving circuit.

Figure 7:
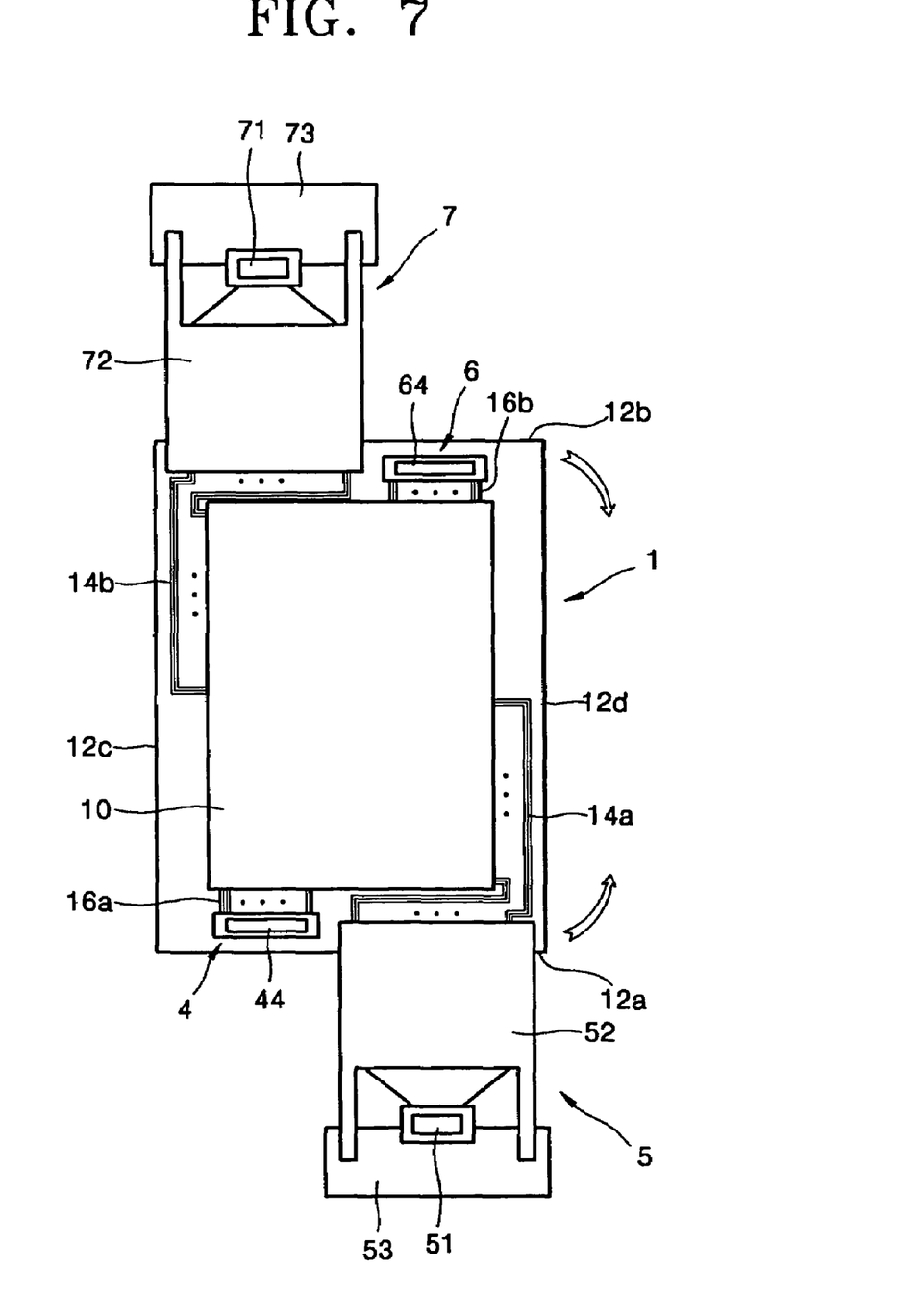
FIG. 7 is a plan view of a flexible flat panel display according to another embodiment of the present invention.
Figure 8:
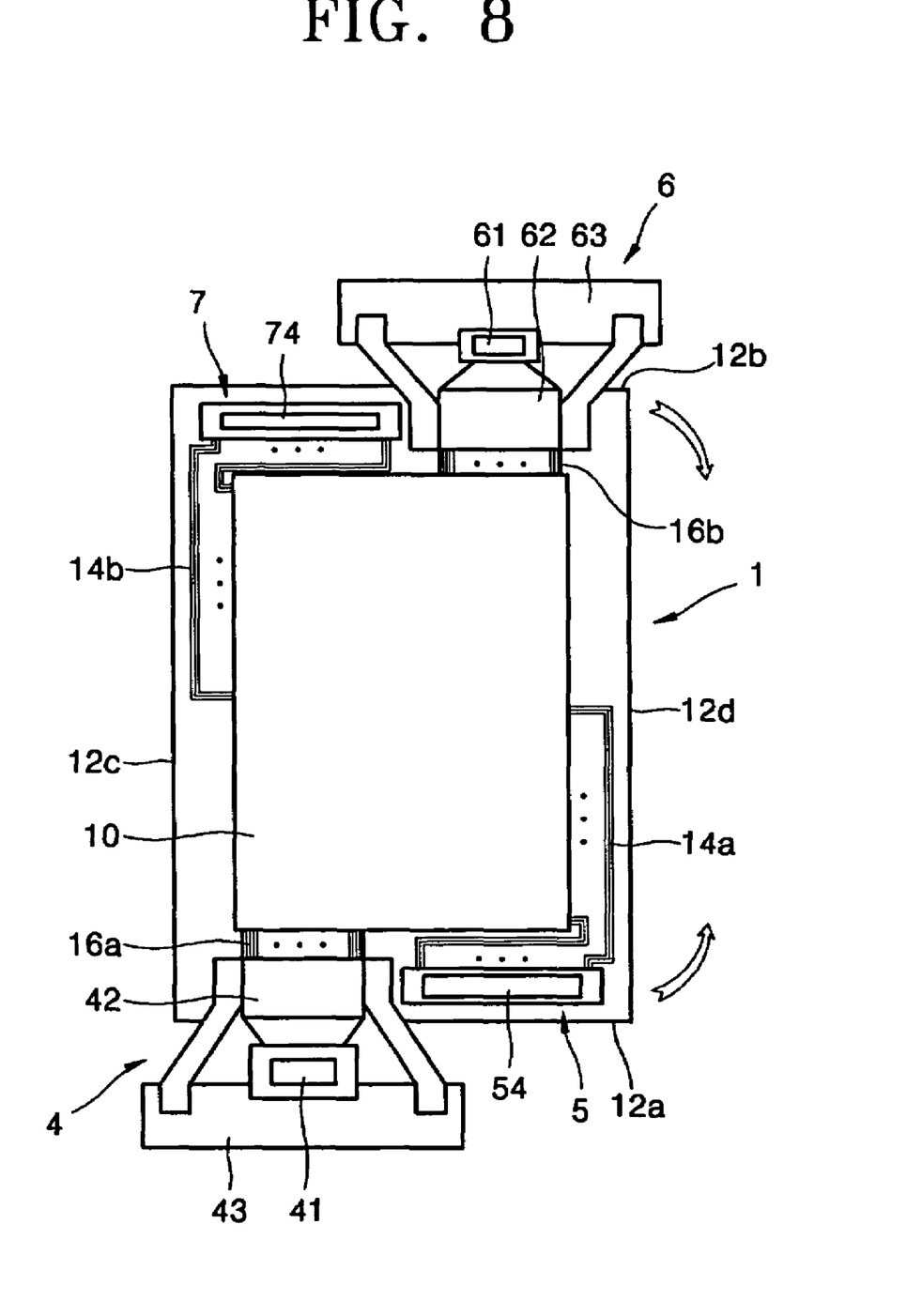
FIG. 8 is a plan view of a flexible flat panel display according to another embodiment of the present invention.

FIG. 7 is a plan view of a flexible flat panel display according to another embodiment of the present invention. In FIG. 7, the third electronic unit 4 and the fifth electronic unit 6 are formed by a first data driving unit 44 and a second data driving unit 64, each of which includes a data driving circuit, and the fourth electronic unit 5 and the sixth electronic unit 7 are formed by a first scan driving unit 54 and a second scan driving unit 74, each of which includes a scan driving circuit. Although not illustrated, each of the third through sixth electronic units 4, 5, 6, and 7 can be formed by a data driving unit including a data driving circuit and a scan driving unit including a scan driving unit.

The present invention is applied not only to a structure in which a scan driving IC and a data driving IC are mounted on a flexible printed circuit board and the flexible printed circuit board is connected to the flexible display unit, but also to a structure in which the scan driving IC and the data driving IC are directly mounted on the first side and/or the second side of the flexible display unit.

A flexible printed circuit board according to the present invention is applied not only to the organic light emitting display described above, but also to any flexible flat panel display.

According to the present invention, electronic units such as a flexible printed circuit board and a driving IC are not mounted on sides of a flexible display unit to be bent, but are mounted on sides perpendicular to the bent sides, and thus the electronic units are not affected by a bending stress even when a flexible display unit is bent and the electronic units are prevented from being separated from the flexible display unit.

While the present invention has been particularly shown and described with reference to exemplary embodiments thereof, it will be understood by those of ordinary skill in the art that various modifications in form and detail can be made therein without departing from the spirit and scope of the present invention as defined by the following claims.

What is claimed is:

1. A flexible flat panel display, comprising:
   a flexible display unit including a display area adapted to display an image, a first side and a second side parallel to edges of the display area, and a third side and a fourth side perpendicular to the first and second sides, wherein only the third side and the fourth side are adapted to being bent and the first and second sides are adapted to remain unbent;
   electronic units arranged solely on at least one of the first and second sides and absent the third and fourth sides, and
   a flexible circuit board only bonded to at least one of the first and second sides and not bonded to the third and forth sides;
   wherein the third and fourth sides are free of electronic units and flexible circuit boards.

2. The flexible flat panel display of claim 1, wherein the electronic unit is arranged on the first side and includes a scan driving circuit.

3. The flexible flat panel display of claim 2, wherein the electronic unit arranged on the first side includes a scan driving IC including the scan driving circuit.

4. The flexible flat panel display of claim 2, wherein the electronic unit arranged on the first side includes a scan driving unit including the scan driving circuit and is patterned on the first side.

5. The flexible flat panel display of claim 1, wherein the electronic unit is arranged on the second side and includes a data driving circuit.

6. The flexible flat panel display of claim 5, wherein the electronic unit arranged on the second side includes a data driving IC including the data driving circuit.

7. The flexible flat panel display of claim 5, wherein the electronic unit arranged on the second side includes a data driving unit which includes the data driving circuit and is patterned on the second side.

8. The flexible flat panel display of claim 1, wherein the electronic unit is arranged on the first side and includes a flexible circuit board bonded to the first side.

9. The flexible flat panel display of claim 1, wherein the electronic unit is arranged on the second side and includes a flexible circuit board bonded to the second side.

10. The flexible flat panel display of claim 1, wherein the electronic unit is arranged on the first side and includes a first scan driving circuit and a first data driving circuit.

11. The flexible flat panel display of claim 10, wherein the electronic unit arranged on the first side includes a first scan driving IC including the first scan driving circuit.

12. The flexible flat panel display of claim 10, wherein the electronic unit arranged on the first side includes a first scan driving unit including the first scan driving circuit and is patterned on the first side.

13. The flexible flat panel display of claim 10, wherein the electronic unit arranged on the first side includes a first data driving IC including the first data driving circuit.

14. The flexible flat panel display of claim 10, wherein the electronic unit arranged on the first side includes a first data driving unit including the first data driving circuit and is patterned on the first side.

15. The flexible flat panel display of claim 1, wherein the electronic unit is arranged on the second side and includes a second scan driving circuit and a second data driving circuit.

16. The flexible flat panel display of claim 15, wherein the electronic unit arranged on the second side includes a second scan drive IC including the second scan driving circuit.

17. The flexible flat panel display of claim 15, wherein the electronic unit arranged on the second side includes a second scan driving unit including the second scan driving circuit and is patterned on the second side.

18. The flexible flat panel display of claim 15, wherein the electronic unit arranged on the second side includes a second data driving IC including the second data driving circuit.

19. The flexible flat panel display of claim 15, wherein the electronic unit arranged on the second side includes a second data driving unit including the second data driving circuit and is patterned on the second side.

20. A flexible flat panel display, comprising:
    a display area adapted to be bent in at least one direction and to display an image;
    a plurality of first wires intersecting the display area and extending along sides of the display area, the sides of the display area being bent; and
    a plurality of second wires intersecting the display area and extending along other sides of the display area, the other sides of the display area not being bent;
    wherein the first wires and the second wires extend along the sides of the display area to locations external to the display area.

21. The flexible flat panel display of claim 20, wherein the first wires and the second wires extend in opposite directions external to the display area.

22. The flexible flat panel display of claim 20, wherein the first wires and the second wires extend in the same direction external to the display area.

23. The flexible flat panel display of claim 20, wherein external to the display area, some of the first wires and second wires extend in one bending direction of the bent sides of the display area, and wherein the other of the first wires and second wires extend in another bending direction different from the one bending direction.

* * * * *